United States Patent
Asakawa

(10) Patent No.: US 7,423,917 B2
(45) Date of Patent: Sep. 9, 2008

(54) DATA READOUT CIRCUIT OF MEMORY CELLS, MEMORY CIRCUIT AND METHOD OF READING OUT DATA FROM MEMORY CELLS

(75) Inventor: Masashi Asakawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/905,323

(22) Filed: Sep. 28, 2007

(65) Prior Publication Data

US 2008/0068898 A1   Mar. 20, 2008

Related U.S. Application Data

(63) Continuation of application No. PCT/JP2005/006343, filed on Mar. 31, 2005.

(51) Int. Cl.
 *G11C 7/00* (2006.01)
(52) U.S. Cl. .............................. 365/189.15; 365/189.02
(58) Field of Classification Search ............ 365/189.15, 365/189.02
See application file for complete search history.

(56) References Cited

U.S. PATENT DOCUMENTS

| | | | |
|---|---|---|---|
| 5,623,444 A * | 4/1997 | Gotou et al. ........... | 365/185.23 |
| 5,802,551 A | 9/1998 | Komatsu et al. | |
| 5,812,470 A * | 9/1998 | Ochoa et al. ................. | 365/201 |
| 5,966,720 A | 10/1999 | Itoh et al. | |
| 5,983,312 A | 11/1999 | Komatsu | |
| 6,625,072 B2 * | 9/2003 | Ohtani et al. ............... | 365/200 |

FOREIGN PATENT DOCUMENTS

| | | |
|---|---|---|
| JP | 5-233426 | 9/1993 |
| JP | 7-105691 | 4/1995 |
| JP | 2001-43691 | 2/2001 |

OTHER PUBLICATIONS

International Search Report of the International Application No. PCT/JP2005/006343 (mailed on Jun. 28, 2005).

* cited by examiner

*Primary Examiner*—Tuan T. Nguyen
(74) *Attorney, Agent, or Firm*—Staas & Halsey LLP

(57) ABSTRACT

A data readout circuit of memory cells for reading out data from the memory cells includes a determination circuit (3) that reads out a plurality of data from multiplexed memory cells (5) having a unique data inversion direction and determines data not inverted in the data inversion direction as valid data stored in the memory cells (5) in a case when there are different data in the readout data; and an output unit (4) that outputs the data determined as valid data by the determination circuit (3) as memory data of the memory cells.

9 Claims, 3 Drawing Sheets

DATA READOUT CIRCUIT OF MEMORY CELLS, MEMORY CIRCUIT AND METHOD OF READING OUT DATA FROM MEMORY CELLS

CROSS REFERENCE TO RELATED APPLICATIONS

This application is a continuation application, filed under 35 USC 111(a), of International Application PCT/JP2005/006343, filed Mar. 31, 2005, which is herein incorporated by reference in its entirety.

TECHNICAL FIELD

The present invention relates to data readout circuit of memory cells, a memory circuit and a method of reading out data from memory cells for correcting soft errors in the memory cells.

BACKGROUND ART

In recent years, for memory devices, miniaturization of process, increase of capacity and decrease in voltage have been promoted. This trend leads to a problem of increased rate of soft errors. Here, the soft errors are different from hard errors due to physical failures and the like disabling memory cells and are caused by environmental influences such as neutron rays. For the soft errors, memory devices become available by rewriting data.

In conventional memory devices, countermeasures have been taken against the soft errors such as error detection by redundancy and parity check or error correction by a majority decision circuit and an ECC circuit.

As a conventional art relating to the present invention, for example, Patent Document 1 described below is known. The semiconductor memory having an error correction function corrects errors of memory cells by using memory cell array units having odd numbers of three or more memory cells and majority decision circuits for each memory cell array unit.

Patent Document 1: Jpn. Pat. Appln. Laid-Open Publication No. 6-52697

DISCLOSURE OF THE INVENTION

Problem to be Solved by the Invention

However, errors cannot be corrected only by the error detection. Moreover, a complicated circuit for error correction is required to correct errors. For example, the semiconductor memory having an error correction function of Patent Document 1 requires memory cell array units having odd numbers of three or more memory cells respectively and majority decision circuits for each memory cell array unit.

The present invention has been made to solve the above problems and has an object of providing a data readout circuit of memory cells, a memory circuit and a method of reading out data from memory cells capable of correcting errors of memory cells without using a complicated circuit.

Means for Solving the Problem

In view of the above, the present invention provides a data readout circuit of memory cells for reading out data from the memory cells. The data readout circuit includes a determination circuit that reads out a plurality of data from multiplexed memory cells having a unique data inversion direction and determines data not inverted in the data inversion direction as valid data stored in the memory cells in a case when there are different data in the readout data, and an output unit that outputs the data determined as the valid data by the determination circuit as memory data of the memory cells.

Further, in the data readout circuit of memory cells according to the present invention, the determination circuit determines any of the data in the multiplexed memory cells as valid data stored in the memory cells in a case when all the data read out from the multiplexed memory cells are equal.

Moreover, in the data readout circuit of memory cells according to the present invention, the determination circuit is an OR circuit.

Furthermore, the present invention provides a memory circuit having multiplexed memory cells having a unique data inversion direction. The memory circuit includes a determination circuit that reads out a plurality of data from the multiplexed memory cells and determines data not inverted in the data inversion direction as valid data stored in the memory cells in a case when there are different data in the readout data, and an output unit that outputs the data determined as valid data by the determination circuit as memory data of the memory cells.

Further, in the memory circuit according to the present invention, the determination circuit determines any of the data in the multiplexed memory cells as valid data stored in the memory cells in a case when all the data read out from the multiplexed memory cells are equal.

Moreover, the memory circuit according to the present invention includes a multiplicity setting section capable of selectively setting the multiplicity of the memory cells to be multiplexed, and the determination circuit reads out data from all the memory cells selectively multiplexed by the multiplicity setting section and performs the determination.

Moreover, in the memory circuit according to the present invention, the determination circuit is an OR circuit.

Further, the present invention provides a method of reading out data from memory cells. The method includes a determining step that reads out a plurality of data from the multiplexed memory cells having a unique data inversion direction and determines data not inverted in the data inversion direction as valid data stored in the memory cells in a case when there are different data in the readout data, and an outputting step that outputs the data determined as valid data by the determination circuit as memory data of the memory cells.

Moreover, in the method of reading out data from memory cells according to the present invention, the determination step determines any of the data in the multiplexed memory cells as valid data stored in the memory cells in a case when all the data read out from the multiplexed memory cells are equal.

BEST MODE FOR CARRYING OUT THE INVENTION

Now, the present invention will be described with reference to the accompanying drawings.

Memory cells express the data value by an amount of charge. In the present embodiment, the data value in a state where the memory cells have a large amount of charge is set to "1" whereas the data value in a state where the memory cells have a small amount of charge is set to "0". The present invention is applied to a memory such as a DRAM (Dynamic Random Access Memory), a flash RAM (Random Access Memory) and the like in which the data inversion direction due to soft errors of memory cells is fixed. In such a memory, a soft error occurs as inverting data from a state of a large amount of charge to state of a small amount of charge due to the charges of the memory cells moved by the influences of neutron rays and the like. That is, the inversion direction of the soft error in the present embodiment is a direction from "1" to "0".

First, the configuration of the embodiment of the present invention will be described.

Figure 1:
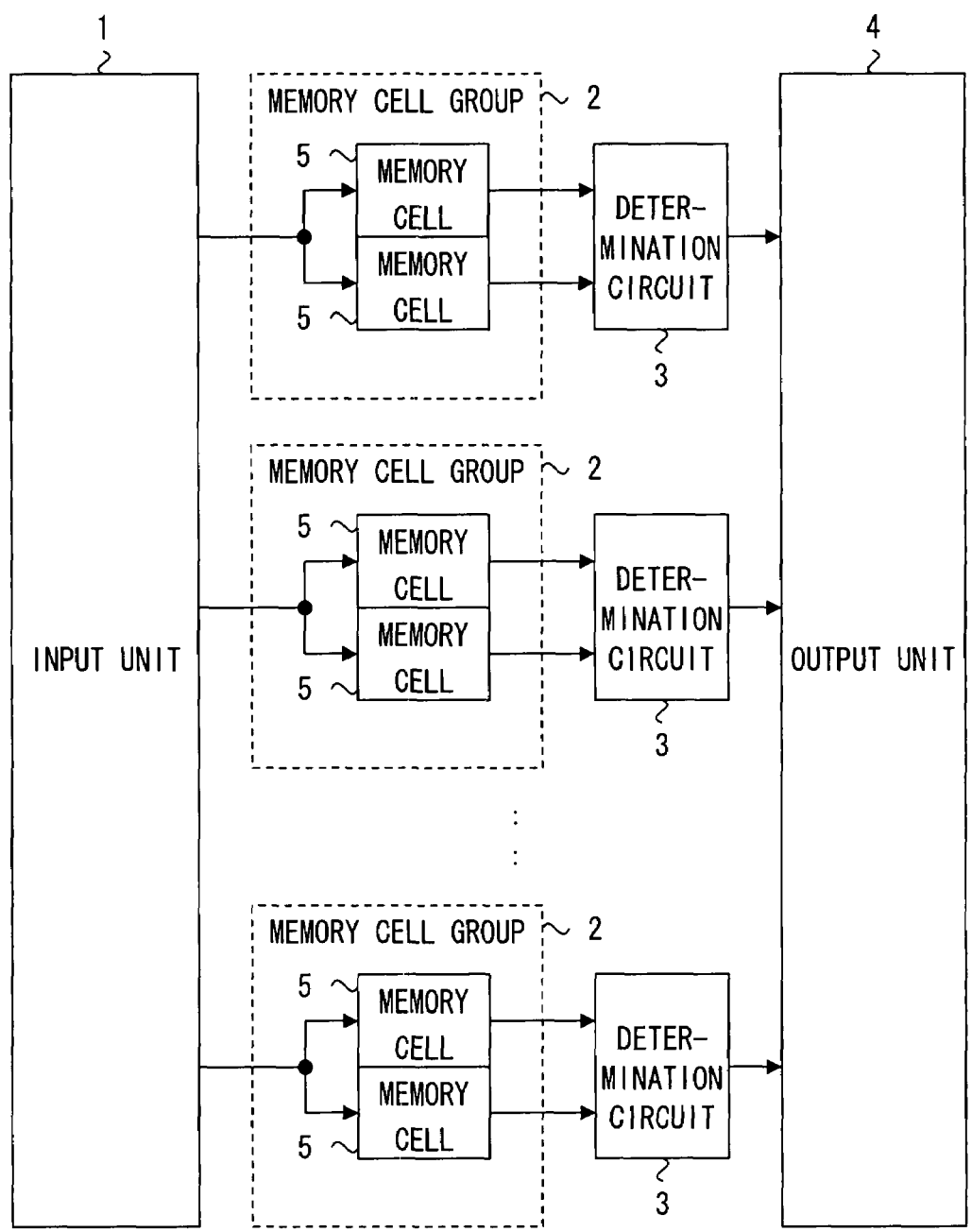
FIG. 1 is a block diagram showing one example of a configuration of an embodiment of the present invention.

FIG. 1 is a block diagram showing one example of a configuration of an embodiment of the present invention. The present embodiment includes an input unit 1, memory cell groups 2, determination circuits 3 and an output unit 4. Each of the memory cell groups 2 has two adjacent memory cells 5 being multiplexed. The memory groups 2 include the determination circuits 3.

The operation of the embodiment of the present invention will be described.

First, a data write operation in the present embodiment will be described. The data input unit 1 transfers data to an instructed memory cell group 2 according to a data write instruction from the outside. The data inputted into the memory cell group 2 are equally written into all the memory cells 5.

Figure 2:
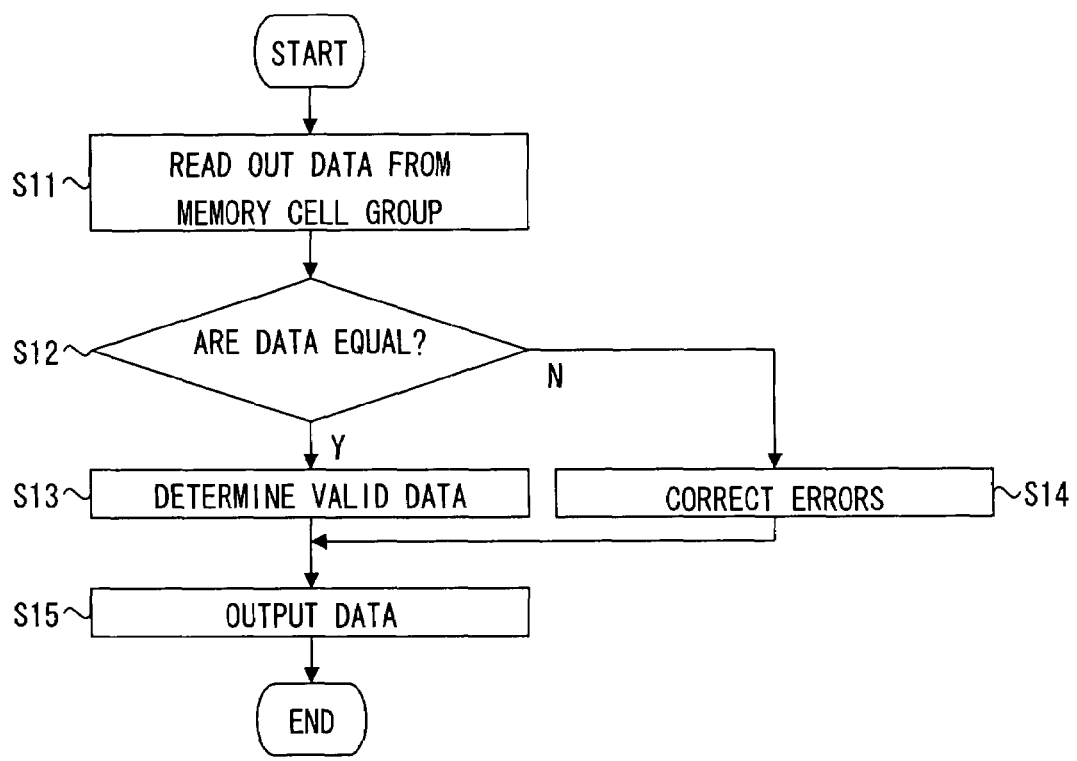
FIG. 2 is a flowchart showing one example of a data readout operation in the embodiment of the present invention.

Next, a data readout operation in the present embodiment will be described. FIG. 2 is a flowchart showing one example of a data readout operation in the embodiment of the present invention. First, the determination circuit 3 reads out data from all the memory cells 5 in the corresponding memory cell group 2 (S11). Then, the determination circuit 3 determines whether or not the data from all the memory cells 5 are equal (S12). When the data are equal (S12, Y), the determination circuit 3 determines that there are no soft errors, determines the equal data read out from the memory cell group 2 as valid data (S13) and proceeds to processing S15. On the other hand, when the data are different (S12, N), the determination circuit 3 determines that there is a soft error, corrects the error (S14) and proceeds to processing S15. Here, the correction of error means that the data not inverted in the inversion direction due to the soft error are determined as valid data. The inversion direction in the present embodiment is a direction from "1" to "0". Therefore, of the different data in the memory cell group 2, the data with a value of "0" are determined as data inverted due to a soft error and the data with a value of "1" are determined as non-inverted valid data. Such a determination circuit 3 can be realized using an OR circuit and thus can be realized in an extremely small circuit scale.

Then, the output unit 4 outputs the valid data determined by the determination circuit 3 to the outside (S15) and ends this flow.

In addition, although the multiplicity of the memory cells 5 in the memory cell group 2 is set to 2 in the embodiment, the multiplicity may be increased and the memory cell group may include more adjacent memory cells if there is room in the unused areas of the memory cells. This increased multiplicity can reduce the cases of disabling error corrections due to errors included in all the memory cells 5 in the memory cell group 2 and improve reliability.

Figure 3:
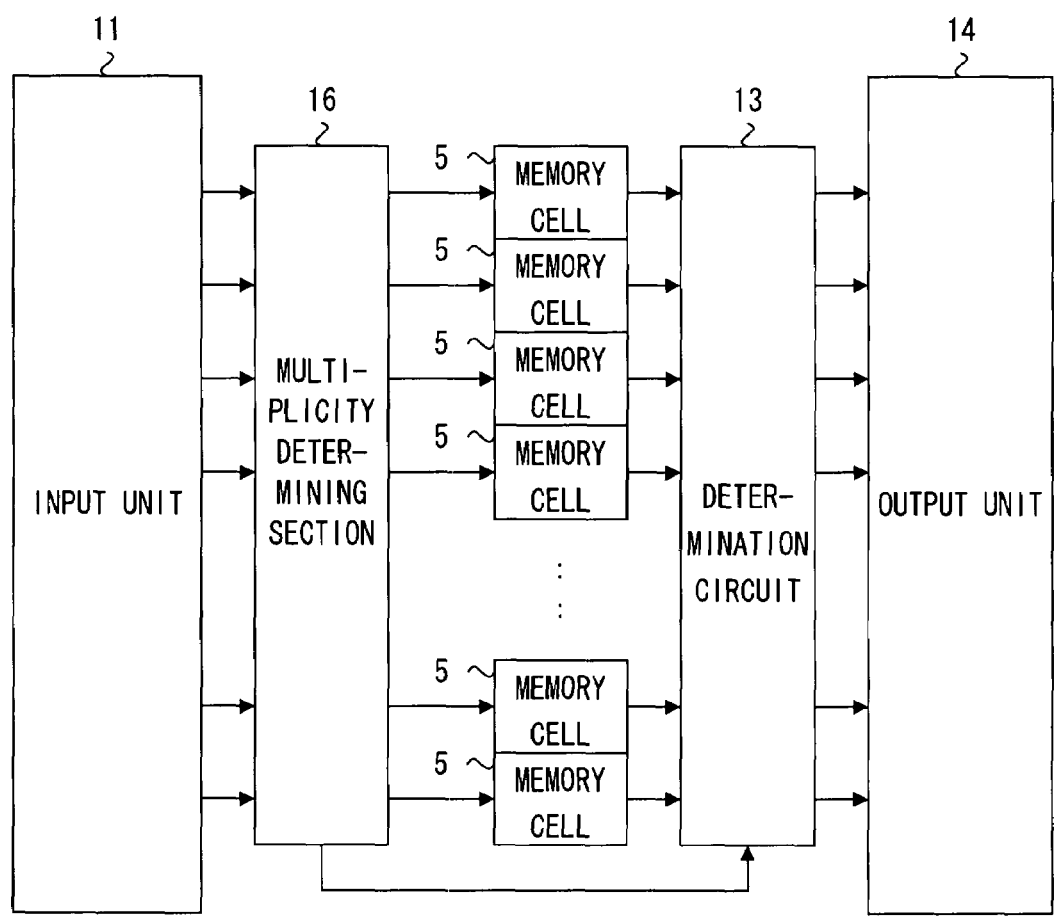
FIG. 3 is a block diagram showing another example of the configuration of the embodiment of the present invention.

Moreover, the multiplicity may be set by an instruction from the outside depending on the number of unused areas of the memory cells and a required reliability. FIG. 3 is a block diagram showing another example of the configuration according to the embodiment of the present invention. In FIG. 3 the same numerals as those in FIG. 1 denote the same parts or equivalents as those shown in FIG. 3, and the description thereof will be omitted here. In FIG. 3, as compared to FIG. 1, the input unit 1 is replaced with an input unit 11, the determination circuits 3 are replaced with a determination circuit 13, the output unit 4 is replaced with an output unit 14, and a multiplicity setting section 16 is newly added. According to an instruction from the outside, the multiplicity setting section 16 sets a memory cell group in which a given number of memory cells 5 are multiplexed. In writing data, the input unit 11 writes data into the memory cell group set by the multiplicity setting section 16. In reading data, the determination circuit 13 reads out data from the memory cell group set by the multiplicity setting section 16, performs the above-described data readout operation and determines valid data. The output unit 14 outputs the valid data determined by the determination circuits 13 to the outside.

In addition, the determining step corresponds to the processings S11, S12, S13 and S14 in the embodiment, and the outputting step corresponds to the processing S15 in the embodiment.

INDUSTRIAL APPLICABILITY

As described above, according to the present invention, error correction can be performed only by two or more memory cells and a very simple determination section, thereby allowing circuit scale to be reduced remarkably compared to the conventional error correction by majority decision requiring three or more memory cells and a majority determination section or the error correction by ECC requiring a complicated calculation circuit.

The invention claimed is:

1. A data readout circuit of memory cells for reading out data from the memory cells, comprising:
   a determination circuit that reads out a plurality of data from multiplexed memory cells having a unique data inversion direction and determines data not inverted in the data inversion direction as valid data stored in the memory cells in a case when there are different data in the readout data; and
   an output unit that outputs the data determined as valid data by the determination circuit as memory data of the memory cells.

2. The data readout circuit of memory cells according to claim 1, wherein
   the determination circuit determines any of the data in the multiplexed memory cells as valid data stored in the memory cells in a case when all the data read out from the multiplexed memory cells are equal.

3. The data readout circuit of memory cells according to claim 1, wherein
   the determination circuit is an OR circuit.

4. A memory circuit having multiplexed memory cells having a unique data inversion direction, comprising:
   a determination circuit that reads out a plurality of data from the multiplexed memory cells and determines data not inverted in the data inversion direction as valid data stored in the memory cells in a case when there are different data in the readout data; and
   an output unit that outputs the data determined as valid data by the determination circuit as memory data of the memory cells.

5. The memory circuit according to claim 4, wherein
   the determination circuit determines any of the data in the multiplexed memory cells as valid data stored in the memory cells in a case when all the data read out from the multiplexed memory cells are equal.

6. The memory circuit according to claim 4, comprising:
   a multiplicity setting section capable of selectively setting the multiplicity of the memory cells to be multiplexed, and the determination circuit reads out data from all the memory cells selectively multiplexed by the multiplicity setting section and performs the determination.

7. The memory circuit according to claim 4, wherein the determination circuit is an OR circuit.

8. A method of reading out data from memory cells, comprising:

a determining step that reads out a plurality of data from the multiplexed memory cells having a unique data inversion direction and determines data not inverted in the data inversion direction as valid data stored in the memory cells in a case when there are different data in the readout data; and an outputting step that outputs the data determined as valid data by the determination circuit as memory data of the memory cells.

9. The method of reading out data from memory cells according to claim 8, wherein the determination step determines any of the data in the multiplexed memory cells as valid data stored in the memory cells in a case when all the data read out from the multiplexed memory cells are equal.

* * * * *